Nov. 17, 1964 C. R. ESHELMAN 3,157,797
SWITCHING CIRCUIT
Filed Aug. 1, 1962
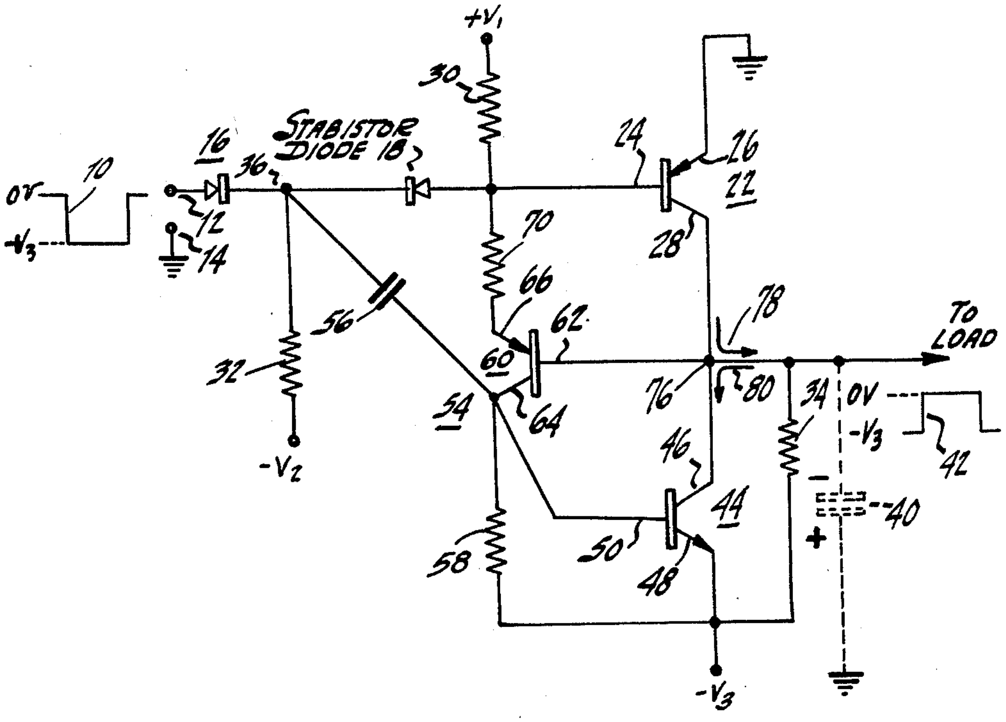
INVENTOR.
CHARLES R. ESHELMAN
BY John V. Regan
Attorney

3,157,797
SWITCHING CIRCUIT

Charles R. Eshelman, Granada Hills, Calif., assignor to Radio Corporation of America, a corporation of Delaware Filed Aug. 1, 1962, Ser. No. 214,073
6 Claims. (Cl. 307—88.5)

This invention relates to switching circuits and, in particular, to a transistor switching circuit.

Transistors, as used in switching circuits, generally are operated as large signal, nonlinear devices in which the transistors are operated either in saturation or cutoff. It is desired that there be a fast transition between output signal levels when the transistor is switched. However, minority carriers are stored in the base region of a saturated transistor. These carriers require a definite length of time to be collected after the input signal terminates, whereby the trailing edge of the output signal lags the termination of the input signal in point of time. Moreover, the trailing edge of the output signal is not abrupt, but rather is more or less exponential.

Storage, or saturation delay, has the effect of widening the output pulse width and reducing the switching speed and the maximum repetition rate. Storage time may be avoided by preventing the transistor from saturating, but this is accomplished at the expense of increased power dissipation in the transistor, greater turn-on delay and a generally variable output signal level.

Another important factor which affects switching speed is the circuit capacitance, especially the capacitance in the output, or load, portion of the circuit. This capacitance may be stray capacitance and/or load capacitance, such as in a transmission line. The capacitance in the output circuit is rapidly charged (or discharged) through the low impedance collector-emitter path of the transistor when the transistor is in saturation. However, when the transistor turns off, the capacitance must discharge (or charge) through the resistance in the output circuit. Since this resistance is relatively high, generally speaking, the discharge time of the capacitance is much longer than the charge time. The capacitance thus has the effect of preventing a fast transition between the two output levels when the input signal terminates, the transition being exponential in nature and determined by the RC time constant. The discharge time of the capacitance may be decreased, for example, by providing a collector supply resistor of suitably low value, but this wastes power and introduces problems in cooling.

Furthermore, current often must be supplied to the load when the transistor is in one operating condition, and adsorbed from the load when the transistor is in its other operating condition. Any current flowing between the circuit and the load flows through the collector supply resistor in the nonconducting condition of the transistor, and has the effect of changing the output signal level.

It is among the objects of this invention to provide an improved switching circuit which has a reduced switching time and a fast rise and fall time characteristic.

It is another object of this invention to provide a switching circuit in which a change in input signal produces a change in output signal with reduced delay.

It is still another object of this invention to provide a high speed, transistor switching circuit in which the trailing edge of the output signal changes abruptly when the input signal terminates.

It is a further object of this invention to provide a high speed switching circuit in which the output capacitance may be charged and discharged rapidly without adversely affecting the wave-shape of the output signal, and in which current may be both supplied to, and absorbed from, the load without affecting the output signal level.

These and other objects are accomplished according to the present invention by the combination of first and second transistors of opposite conductivity type, operated in the common emitter configuration, and having their collector electrodes connected together and their emitter electrodes connected through a power supply. Input pulses applied between the base and emitter electrodes of the first transistor render the first transistor conductive, preferably saturating the first transistor. The input pulses also are differentiated and then applied to the base electrode of the second transistor to render the second transistor conductive in response to the trailing edge of an input pulse. A third transistor, of the same conductivity type as the first transistor, has its base and collector electrodes directly connected to the collector and base electrodes of the second transistor and has its emitter electrode connected through an element of resistance to the base electrode of the first transistor. The third transistor is rendered conductive when the trailing edge of the input signal turns the second transistor on. The output of the second transistor is regeneratively coupled to the input of the second transistor by way of the third transistor to maintain the second transistor conductive in the absence of an input pulse.

As will be described more fully hereinafter, the first transistor supplies current to the load when an input signal is present, and the second transistor can absorb current from the load in the absence of an input signal. The second transistor also provides a low impedance path for dissipating the minority carriers stored in the first transistor and prevents storage time effects in the first transistor from affecting the output signal. Inasmuch as the first and second transistors conduct out of phase, there is always present a low impedance path for discharging and charging any capacitance in the output circuit.

In the accompanying drawing, the sole figure is a schematic diagram of a high speed switching circuit according to the invention.

Input pulses 10 are applied to the circuit across a pair of input terminals 12, 14. Input terminal 14 is connected to a point of reference potential, indicated schematically by the conventional symbol for circuit ground. Input terminal 12 is connected by the series combination of a coupling diode 16 and a level shifting diode 18, for example a stabistor diode, to the base electrode 24 of a first PNP transistor 22. A level shifting diode may be defined as one having a closely controlled, forward conducting threshold characteristic. Coupling diode 16 and level shifting diode 18 are connected back-to-back, that is to say, with their easy current flow directions opposing one another. Another type of level shifting means, such as a parallel RC network, could be used instead of the diode 18. The level shifting diode is preferred, however, because it has a sharp threshold which provides a high degree of noise immunity. Also, the level shifting diode 18 has capacitance which aids in fast turn-on and turn-off of the transistor 22.

A resistor 30 is connected between the base electrode 24 and a source of voltage, designated $+V_1$, having a polarity tending to reverse bias the base 24-emitter 26 diode of the transistor 22. A resistor 32 is connected between the junction 36 of coupling diode 16 and level shifting diode 18 and a source of voltage, designated $-V_2$, having a polarity tending to forward bias the base 24-emitter 26 diode. Collector 28 may be connected to a third source of voltage, designated $-V_c$, by way of a collector supply resistor 34, although this connection is not essential, as will be seen as the discussion proceeds. The output load, not shown schematically, is connected to the collector 28. Capacitor 40, shown in dashed lines, represents the output capacitance, including the capacitance of the load and stray capacitance.

The portion of the circuit thus far described is a known type of transistor inverter circuit. The problems which the present invention is designed to overcome may be understood more clearly by considering the operation of the transistor inverter by itself. The input 10 to the circuit is either at zero volts or at $-V_3$ volts. Consider the operation when the input is at zero volts. Coupling diode 16 is forward biased and clamps the voltage at junction 36 at approximately zero volts. The voltage at the base electrode 24 then is positive with respect to ground by an amount at least equal to the threshold potential of the level shifting diode 18. This threshold determines the noise immunity level, and more than one diode 18 may be connected in series to provide a desired threshold. Transistor 22 is biased in the cut-off condition by the positive base 34 voltage and, neglecting leakage current, no current flows in the collector 28. It may be seen that any current absorbed from the output load in the "off" condition of transistor 22 flows through the collector supply resistor 34. Any such current flow, however, changes the voltage level of the output signal and is undesirable. The output capacitance 40 is charged, in the polarity direction indicated, to a nominal value of $-V_3$ volts.

When the input level drops to $-V_3$ volts, coupling diode 16 becomes reverse-biased. The values of the resistors 30 and 32 and voltage sources $V_1$ and $V_2$ are selected so that the base 24-emitter 26 diode becomes forward biased. Transistor 22 saturates in response to negative input pulse 10 and provides a low impedance path for discharging the output capacitance 40. The output voltage at the collector 28 is close to ground potential when transistor 22 is in saturation.

As described previously, minority carriers are stored in the base region of saturated transistor 22. Therefore, the output voltage does not drop immediately to $-V_3$ volts at the termination of the input pulse 10. A finite time is required during which these minority carriers are collected. Accordingly, the trailing edge of the output signal 42 lags the trailing edge of the input signal 10 and results in a widening of the output signal 42. Once the transistor 22 is rendered nonconductive, the capacitor 40 must recharge through the collector supply resistor 34. The charge current flowing through this resistor 34 maintains the output voltage above $-V_3$ volts during the charge period and further delays the trailing edge of the output signal 42. Moreover, the trailing edge is exponentially shaped, as governed by charging of the capacitor 40. The charge time for the capacitor 40 is determined by the values of capacitor 40 and resistor 34, and may be reduced by reducing the value of resistor 34. However, reducing the value of resistor 34 has the effect of increasing the power dissipation, especially during the conducting period of the transistor 22.

The aforementioned disadvantages of the prior art circuit are overcome by the additional circuitry which will now be described. A second, NPN transistor 44 has its collector electrode 46 directly connected to the collector 28 of the first transistor 22 by way of a negligible impedance path. The emitter 48 is connected to the emitter 26 of the first transistor 22 through the voltage source $-V_3$. Base electrode 50 is coupled to junction 36 by a capacitor 56, and is connected to the emitter electrode 48 by a resistor 58. Capacitor 56 and resistor 58 serve to differentiate the input pulses 10. The resistor 58 is of low enough value to supply the collector 46-base 50 leakage current when the second transistor 44 is nonconducting. Thus, the leakage current does not flow through the emitter 48-base 50 diode and become amplified by the beta of the transistor 44.

A third, PNP transistor 60 has its base electrode 62 and collector electrode 64 directly connected to the collector 46 and base 50 electrodes, respectively, of the second transistor 44. A resistor 70 is connected between the emitter electrode 66 of third transistor 60 and the base electrode 24 of first transistor 22.

Consider now the operation of the entire circuit and assume that the input 10 is at zero volts. The first transistor 22 is nonconducting for reasons described previously. The output voltage at the junction 76 of collector electrodes 28 and 46 is $-V_3$ volts, and the capacitor 40 is charged to this value. For reasons which will be described, second transistor 44 is in saturation, and maintained in this condition by regenerative feedback through the third transistor 60.

Negative input pulse 10 switches the first transistor 22 into saturation, and the output voltage rises to approximately zero volts. Capacitor 40 discharges rapidly through the low impedance emitter 26-collector 28 path of this transistor, whereby the capacitor 40 does not appreciably affect the leading edge of output signal 42. Transistor 22 supplies load current in the direction indicated by the arrow 78.

The voltage at the collector electrode 28 becomes slightly more positive than the voltage at the base electrode 24 because of saturation. Accordingly, the base 62-emitter 66 diode of third transistor 60 becomes reverse-biased and shuts off the third transistor 60. This action interrupts the regenerative feedback path and causes the second transistor 44 to become nonconducting. In addition, the negative-going, differentiated leading edge of input pulse 10 is applied across the base 50-emitter 48 diode to provide fast turn-off of the second transistor 44.

The base 24 voltage rises above zero volts and the base 24-emitter 26 diode of the first transistor 22 becomes reverse-biased at the termination of the input pulse 10. Because of the minority carrier storage effect discussed previously, collector 28 current does not cease immediately and, absent the second and third transistors 44 and 60 and related circuitry, the output voltage would not change abruptly to $-V_3$ volts. However, second transistor 44 is driven into conduction by the differentiated trailing edge of the input pulse 10. At the same time, the third transistor 60 is turned on by the positive voltage at the anode of the stabistor diode 18. Conduction in the third transistor 60 is in a direction to increase the base drive to the second transistor 44, turning the second transistor 44 on harder (into saturation) and causing the output voltage to fall rapidly to $-V_3$ volts.

The second transistor 44 not only prevents the minority carrier storage effect in the first transistor 22 from affecting the width of the output pulse 42, but also shortens the recovery time of the first transistor 22 by providing a low impedance path for dissipating the minority carriers. The saturated second transistor 44 also serves as a low impedance path for rapidly charging the capacitor 40, whereby the transition at the trailing edge of the output pulse 42 is abrupt, relatively speaking.

Resistors 30 and 70 in the emitter 66 circuit are chosen in value to maintain the second transistor 44 in heavy conduction as long as the input 10 is at zero volts. Essentially, the third transistor regeneratively couples the output to the input of the second transistor 44. The second transistor 44 can absorb current from the load without a resulting variation in output voltage since this current flows through the low impedance collector 46-emitter 48 path.

By way of illustration only, a circuit according to the invention may have the following values:

| | | |
|---|---|---|
| Diode 16 | | Type 99 |
| Stabistor 18 | | Type 69–872 |
| Transistor 22 | | 2N1204 |
| Transistor 44 | | 2N2217 |
| Transistor 60 | | 2N781 |
| Resistor 30 | ohms | 3.9K |
| Resistor 32 | do | 560 |
| Resistor 58 | do | 1K |
| Resistor 70 | do | 1K |
| Capacitor 56 | pfarads | 180 |

| | | |
|---|---|---|
| Voltage $V_1$ | volts | 12 |
| Voltage $V_2$ | do | 16.5 |
| Voltage $V_3$ | do | 4.5 |

It will be understood that the NPN transistors may be replaced by PNP transistors, and vice versa, provided that voltage supplies of opposite polarity are employed, and provided that the connections to the diodes are reversed.

What is claimed is:

1. A switching circuit comprising:
a first transistor of one conductivity type having first base, collector and emitter electrodes;
a second transistor of the opposite conductivity type having second base, collector and emitter electrodes;
means connecting the second collector and emitter electrodes to the first said collector and emitter electrodes respectively;
input means for applying signal pulses between said first base and emitter electrodes, said pulses having an amplitude and polarity to render said first transistor conductive;
a differentiating network having an input connected to said input means and an output connected to said second base electrode for rendering said second transistor conductive in response to the trailing edge of an input pulse;
and a third transistor of said one conductivity type having base and collector electrodes connected to said second collector and base electrodes, respectively, and an emitter electrode connected to the first base electrode.

2. A switching circuit comprising:
first and second transistors of opposite conductivity type having their collector electrodes connected together, each of said first and second transistors being connected in the common emitter configuration;
pulse input means connected to apply input pulses between the base and emitter electrodes of the first transistor, said input pulses having an amplitude and polarity to render said first transistor conductive;
a differentiating network connected to said pulse input means;
means for applying the differentiated output of said network to the base electrode of the second transistor to render said second transistor conductive in response to the trailing edge of an input pulse;
and a third transistor of the same conductivity type as said first transistor having base and collector electrodes connected to the collector and base electrodes, respectively, of said second transistor, and having an emitter electrode connected to the base electrode of said first transistor.

3. A switching circuit comprising:
first and second transistors of opposite conductivity types having their collector electrodes connected together, each of said first and second transistors being connected in the common emitter configuration;
output load means connected to said collector electrodes;
means for applying input pulses between the base and emitter electrodes of the first transistor, said pulses having an amplitude and polarity to render said first transistor conductive;
a differentiating network connected to receive and differentiate said input pulses;
means for applying the output of said differentiating network to the base electrode of the second transistor to render said second transistor conductive in response to the trailing edge of an input pulse;
and a third transistor of the same conductivity type as said first transistor, said third transistor having base and collector electrodes connected to the collector and base electrodes, respectively, of said second transistor and having an emitter electrode connected to the base electrode of said first transistor.

4. A switching circuit comprising:
a first transistor of one conductivity type having first collector, base and emitter electrodes;
a second transistor of opposite conductivity type having second base, collector and emitter electrodes;
means connecting said second collector and emitter electrodes to said first collector and emitter electrodes, respectively;
input means for applying input pulses between said first base and emitter electrodes to render said first transistor conductive;
a capacitor connected between said input means and the second base electrode;
a resistor connected between said second base and emitter electrodes, said resistor and said capacitor being selected in value to differentiate said input pulses;
and a third transistor of said one conductivity type having base and collector electrodes connected to said second collector and base electrodes, respectively, and having an emitter electrode connected to the first base electrode.

5. A switching circuit comprising:
a first transistor of one conductivity type having a first base electrode, a first emitter electrode and a first collector electrode;
a pair of input terminals, one of which is connected to a reference potential, and the other of which is connected through a level shifting means to said first base electrode, for applying input pulses between the first base and first emitter electrodes, said input pulses having a polarity and magnitude to render said first transistor conductive;
means connected to said first base electrode for biasing said first transistor in the nonconducting condition in the absence of an input pulse;
a second transistor of opposite conductivity type having a second collector electrode direct-current coupled to said first collector electrode, a second base electrode and a second emitter electrode;
means connecting said second emitter electrode to said first emitter electrode;
output load means connected in common to said first collector electrode and said second collector electrode;
a differentiating circuit including a capacitor connected between the second input terminal and said second base electrode and a resistor connected between said second base electrode and said second emitter electrode;
a third transistor of said first conductivity type having a third base electrode connected to said second collector electrode, a third base electrode connected to said second collector electrode, a third collector electrode connected to said second base electrode and a third emitter electrode;
and an element of resistance connected between said third emitter electrode and said second base electrode and having a value to maintain said third transistor on in the conducting state in the absence of an input pulse.

6. A switching circuit comprising:
a first transistor of one conductivity type having a first base electrode, a first emitter electrode and a first collector electrode;
a pair of input terminals, one of which is connected to a reference potential, and the second of which is connected to said first base electrode, for applying input pulses between the first base and first emitter electrodes, said input pulses having a polarity and magnitude to render said first transistor conductive;
means connected to said first base electrode for biasing said first transistor in the non-conducting condition in the absence of an input pulse;
a second transistor of opposite conductivity type having a second collector electrode direct-current coupled to said first collector electrode, a second base electrode and a second emitter electrode;

means connecting said second emitter electrode to said first emitter electrode;

output load means connected in common to said first collector electrode and said second collector electrode;

a differentiating circuit including a capacitor connected between the second input terminal and said second base electrode and a resistor connected between said second base electrode and said second emitter electrode;

a third transistor of said first conductivity type having a third base electrode connected to said second collector electrode, a third collector electrode connected to said second base electrode and a third emitter electrode;

and an element of resistance connected between said third emitter electrode and said first base electrode, said element of resistance and said bias means being selected in value to maintain said third transistor in the conducting condition in the absence of an input pulse.

References Cited in the file of this patent

UNITED STATES PATENTS

| | | |
|---|---|---|
| 2,957,091 | Pace | Oct. 18, 1960 |
| 2,997,606 | Hamburger et al. | Aug. 22, 1961 |